(12) United States Patent
Strope

(10) Patent No.: US 7,961,520 B2
(45) Date of Patent: Jun. 14, 2011

(54) ENCODING AND DECODING TO REDUCE SWITCHING OF FLASH MEMORY TRANSISTORS

(75) Inventor: Todd Ray Strope, Longmont, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 70 days.

(21) Appl. No.: 12/543,044

(22) Filed: Aug. 18, 2009

(65) Prior Publication Data

US 2011/0043388 A1 Feb. 24, 2011

(51) Int. Cl.
*G11C 16/04* (2006.01)
(52) U.S. Cl. .................. 365/185.2; 365/185.27
(58) Field of Classification Search .............. 341/50–90; 382/291, 282; 710/6, 53, 76; 370/392, 486, 370/230; 455/434; 709/231, 202, 224; 375/240.13, 375/240.12, E7.246; 365/185.03, 185.16, 365/185.27, 185, 28, 185.18, 185.33, 185.29, 365/185.08; 711/103, 104, 169, 161, 202
See application file for complete search history.

(56) References Cited

U.S. PATENT DOCUMENTS

| | | | |
|---|---|---|---|
| 4,486,739 A | 12/1984 | Franaszek et al. | |
| 5,177,482 A | 1/1993 | Cideciyan et al. | |
| 6,295,010 B1 | 9/2001 | Thiesfeld | |
| 6,356,478 B1 * | 3/2002 | McCollum | 365/185.01 |
| 6,624,770 B1 | 9/2003 | Tsai et al. | |
| 6,668,308 B2 | 12/2003 | Barroso et al. | |
| 6,717,853 B2 * | 4/2004 | Abedifard et al. | 365/185.16 |
| 6,903,970 B2 * | 6/2005 | Abedifard et al. | 365/185.16 |
| 7,117,332 B2 * | 10/2006 | Lin et al. | 711/168 |
| 7,237,057 B2 * | 6/2007 | Lin et al. | 711/103 |
| 7,404,133 B2 | 7/2008 | McClellan et al. | |
| 7,705,765 B1 * | 4/2010 | Yang | 341/172 |

* cited by examiner

*Primary Examiner* — Lam T Mai
(74) *Attorney, Agent, or Firm* — Westman, Champlin & Kelly, P.A.

(57) ABSTRACT

Methods of encoding data to and decoding data from flash memory devices are provided. User data having an unknown ratio of 1's to 0's is received. The user data is utilized in generating transformed data that has a predictable ratio of 1's to 0's. The transformed data is stored to flash memory. The transformed data is illustratively generate by either applying an "exclusive or" function to the user data or by converting the user data into a number having a greater number of bits.

21 Claims, 7 Drawing Sheets

ENCODING AND DECODING TO REDUCE SWITCHING OF FLASH MEMORY TRANSISTORS

BACKGROUND

Flash memory is a type of non-volatile memory. It is able to hold or persist data in the absence of a power supply. This is as opposed to volatile memories such as dynamic random access memory (DRAM) that lose data when their power supplies are removed.

Flash memory stores data to transistors that have floating gates. The floating gates are able to hold an electric charge. A transistor having a charged floating gate illustratively represents a binary 0, and a transistor having an uncharged floating gate illustratively represents a binary 1.

Before storing or writing data to a group of flash memory transistors, the group is commonly "erased." One example of an erasing process sets all of the transistors in the group to a common state before they are programmed (e.g. the transistors are set to 1). The erasing process illustratively includes de-charging the floating gates of transistors having charged floating gates and leaving the other transistor floating gates (i.e. the uncharged floating gates) as they were.

One drawback of flash memory has been limited lifetimes. For example, flash memory may be limited to a certain number of erase/write cycles.

SUMMARY

An aspect of the disclosure relates to methods of encoding data to and decoding data from flash memory devices. In an embodiment, user data having an unknown ratio of 1's to 0's is received. The user data is utilized to generate transformed data that has a predictable ratio of 1's to 0's. The transformed data is stored to flash memory. In one embodiment, the transformed data is generated by applying an "exclusive or" function to the user data. In another embodiment, the transformed data is generated by converting the user data into a number having a greater number of bits.

These and various other features and advantages that characterize the claimed embodiments will become apparent upon reading the following detailed description and upon reviewing the associated drawings.

DETAILED DESCRIPTION

One cause of the limited lifetime of at least some types of flash memory is the repetitive charging and de-charging of the transistors' floating gates. For example, for illustration purposes only and not by limitation, the charging/de-charging may cause degradation or wear of the insulating material between the floating gate and the underlying silicon. This degradation or wear can have negative impacts such as, but not limited to, making it more difficult to charge a transistor or making it more difficult for a transistor to maintain a charge (i.e. charge "leakage").

Certain embodiments of the present disclosure include encoding or storing data to flash memory and decoding or retrieving data from flash memory in such a manner that the amount of charging/de-charging of transistors may be reduced. This reduction, in at least certain situations, illustratively extends the lifetime of flash memory. For example, in one embodiment, in a system that erases transistors to a 1 before writing, the incoming data is transformed to reduce the amount of 0's. The transformed data is then stored to the flash memory instead of the original data. Accordingly, fewer transistors need to be switched from their erased state, 1, to a 0.

Before going into further details of embodiments, it is worthwhile to first discuss illustrative operating environments in which certain embodiments may be incorporated. Although certain embodiments may be incorporated in environments such as those shown in FIGS. 1 and 2, embodiments are not limited to any particular environment and are illustratively practiced in any number of environments.

Figure 1:
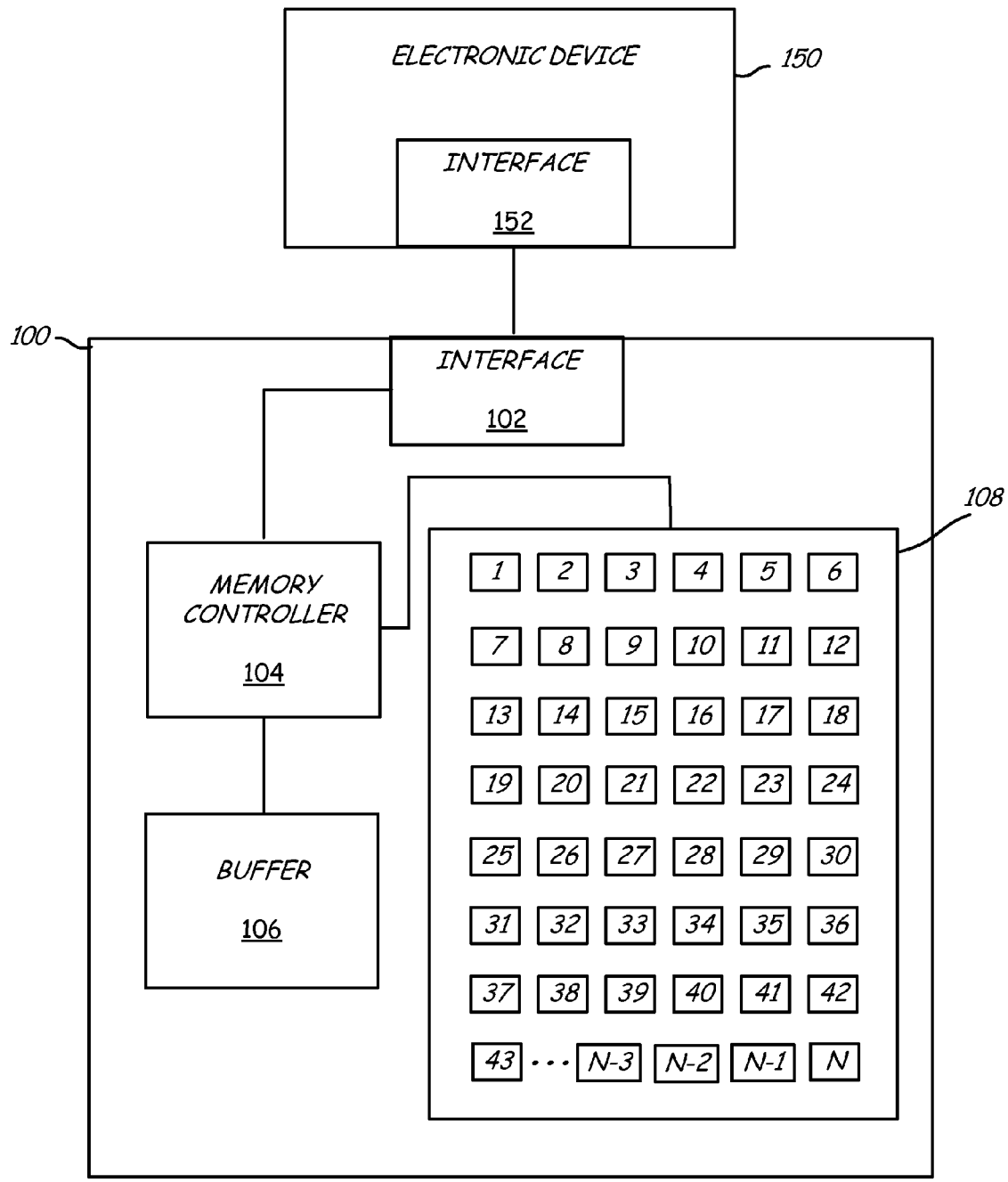
FIG. 1 is a schematic diagram of an electronic device communicatively coupled to a flash memory device.

FIG. 1 is a schematic diagram of a flash memory device 100 communicatively coupled to an electronic device 150. Flash memory device 100 includes an interface 102, a controller 104, a buffer 106, and a group or array of transistors 108. FIG. 1 shows one array having N transistors. Embodiments include any number of transistors per an array and any number of arrays. In an embodiment, transistors are grouped into pages, and pages are grouped into blocks. Embodiments of the present disclosure are not however limited to any specific arrangement of transistors and include any type of configuration or arrangement.

Interface 102 is illustratively coupled to an interface 152 of electronic device 150 such that information or data can be exchanged or sent back and forth between electronic device 150 and memory device 100. Electronic device 150 includes any electronic device such as, but not limited to, a personal computer, a cell phone, a camera, a music player, a gaming device, a host controller, or a personal digital assistant.

Controller 104 illustratively controls or manages the storing or encoding of data to array 108 and the retrieval or decoding of data from array 108. Controller 104 optionally uses a buffer memory 106 in storing or retrieving information from array 108. For example, controller 104 is illustratively configured to write to a specific number of transistors at a time. In such a case, controller 104 stores data to buffer 106 until the appropriate amount of data is accumulated, and controller 104 then transfers data from buffer 106 to array 108.

Figure 2:
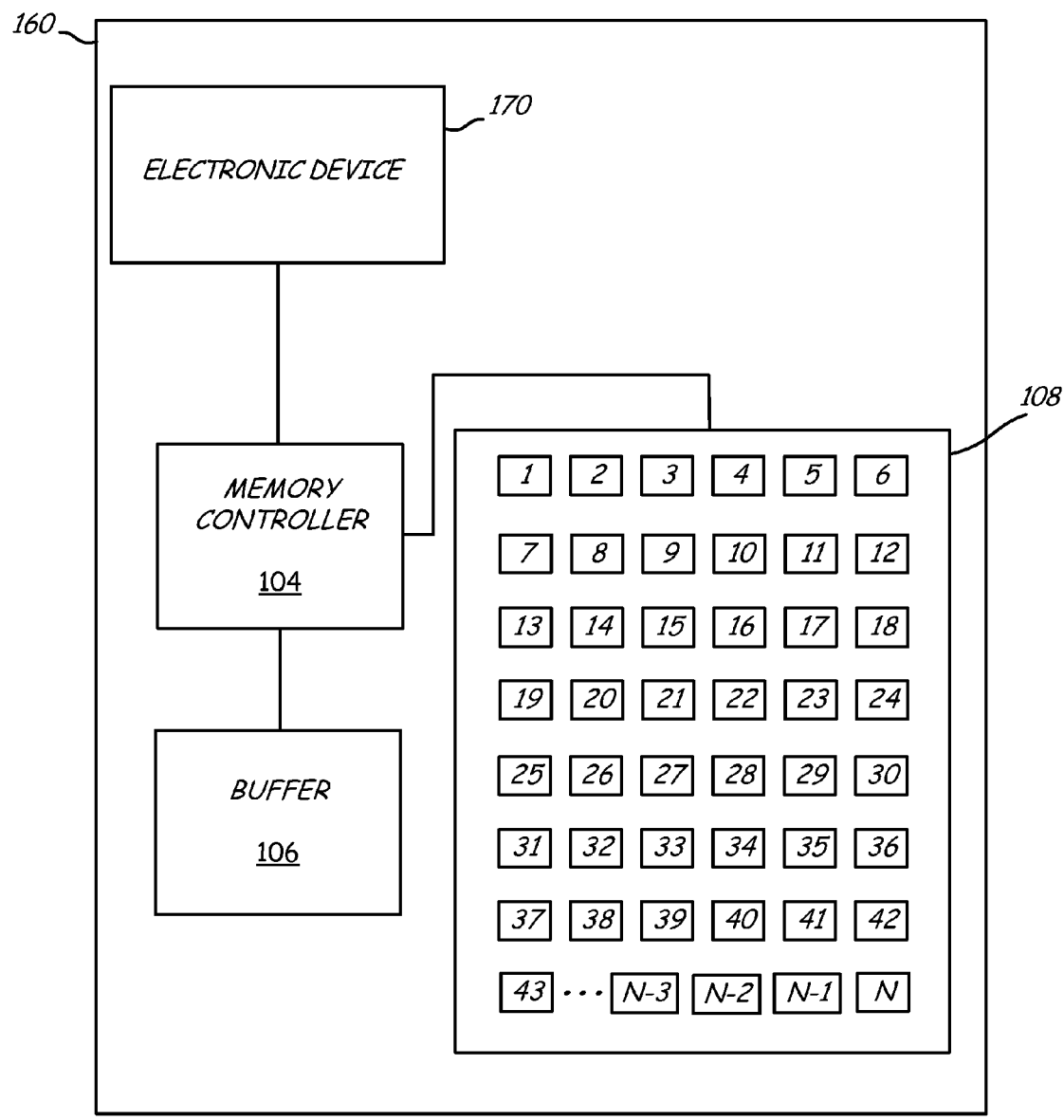
FIG. 2 is a schematic diagram of an electronic device having integrated flash memory.

FIG. 2 is a schematic diagram of an electronic device 170 having integrated flash memory. The environment shown in FIG. 2 has many of the same or similar components as the environment shown in FIG. 1 such as memory controller 104, buffer 106, and array 108. The environment shown in FIG. 2 however differs from that in FIG. 1 in that the electronic components are integrated onto one printed circuit board 160. In such a case, electronic device 170 is illustratively communicatively coupled directly to memory controller 104 instead of through one or more interfaces such as those shown in FIG. 1.

As was previously mentioned, FIGS. 1 and 2 are merely illustrative operating environments. Embodiments of the present disclosure are optionally practiced within any number of different types of operating environments. For example, in one embodiment of a flash memory device, the encoding and decoding of information to and from the memory array are performed or managed by an external device. In another embodiment, the components of a flash memory device are comprised in one physical unit (e.g. one piece of silicon or one printed circuit board). In yet another embodiment, the components are comprised in separate physical units (e.g. multiple pieces of silicon or multiple printed circuit boards).

Figure 3:
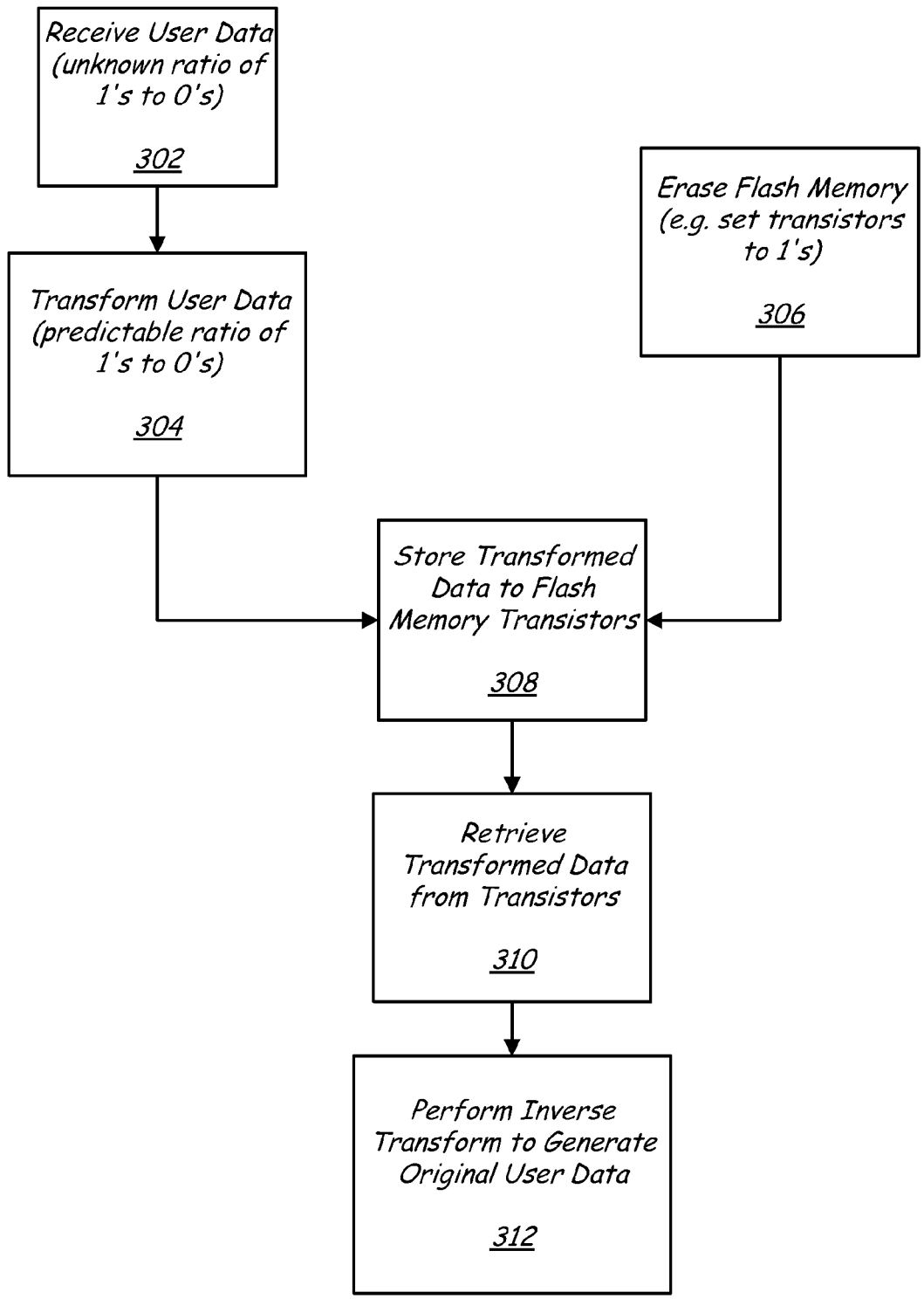
FIG. 3 is a block diagram of a method of encoding data to and decoding data from flash memory.

FIG. 3 is a block diagram of a method encoding data to and decoding data from flash memory. At block 302, a flash memory device receives user data. User data is illustratively data that a user intends to store to and/or retrieve from a memory device. User data may also include data such as error correction code data, mapping/addressing data, encryption data, etc. The user data illustratively has an unknown ratio of 1's to 0's. In an embodiment, the ratio may vary from having all 1's to having all 0's. If the user data was written directly to the flash memory, this characteristic of the user data (i.e. the unknown and variable ratio of 1's to 0's) can decrease the lifetime of the flash memory. For instance, in a system that erases transistors to 1's before writing, if the user data is all 0's and it is written to the flash memory, then each of the transistors needs to be switched.

At block 304, the user data is transformed. The user data is illustratively transformed from having an unknown ratio of 1's to 0's, to having a known or predictable ratio of 1's to 0's. In an embodiment, the transformed data has approximately the same number of 1's and 0's (i.e. the ratio of 1's to 0's is approximately 1). In other embodiments, the transformed data has more 1's than 0's (i.e. the ratio of 1's to 0's is greater than 1), or the transformed data has more 0's than 1's (i.e. the ratio of 1's to 0's is less than 1). More specific transformation processes are discussed in connection with the descriptions of FIGS. 4-7 below. However, it is worth noting at this point that the transformed data illustratively reduces the number of transistors that need to be switched. For example, in a system that erases transistors to 1's before writing, the transformed data illustratively includes a higher ratio of 1's to 0's than the user data. This allows the transformed data to be stored to flash memory with a reduced amount of switching of transistors.

At block 306, the flash memory is erased prior to the transformed data being stored. As was previously described, flash memory is commonly erased before being written to. This erasing process illustratively includes resetting transistor values such that they are the same. For the sake of simplicity, erasing processes will be described as setting transistors to 1, uncharged transistors will be described as corresponding to a binary 1, and charged transistors will be described as corresponding to a binary 0. Obviously, uncharged transistors could be described as corresponding to 0, charged transistors could be described as corresponding to 1, and erasing processes could set transistors to a charged state. Embodiments are not limited to any particular characterizations of transistors or methods of erasing.

At block 308, the transformed data is stored or encoded to the flash memory. Although embodiments are not limited to any particular characterizations, blocks 302, 304, 306, and 308 could collectively be viewed as an encoding process. The blocks go from receiving user data to storing the transformed data. Similarly, the blocks that follow, blocks 310 and 312, could be viewed as a decoding process (i.e. retrieving the transformed data and utilizing it to generate the original user data).

At block 310, the transformed data is retrieved (e.g. the values of the transistors are read). At block 312, the transformed data is utilized to generate the original user data (i.e. the data received at block 302). In an embodiment, a transform is used at block 304 to generate the transformed data from the user data, and an inverse of the transform is used at block 312 to generate the user data from the transformed data.

Figure 4:
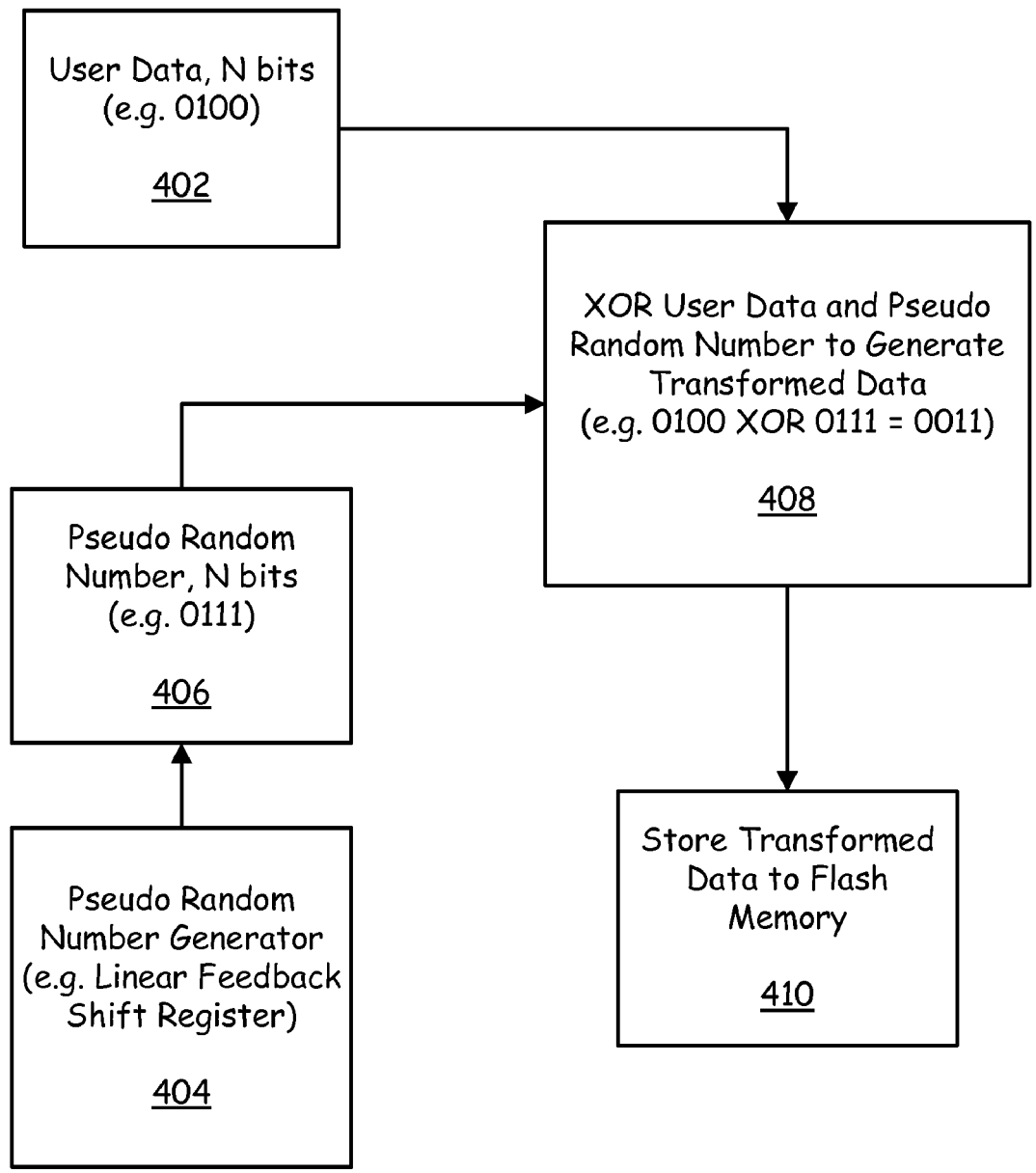
FIG. 4 is a block diagram of a method of encoding user data utilizing a pseudo random number and the "exclusive or" function.

FIG. 4 is a block diagram of a method of transforming user data. The method is illustratively used to generate transformed data that is stored to flash memory (e.g. the transformed data that is stored at block 308 in FIG. 3).

At block 402, user data is received. The user data is illustratively N bits, where N is any number (i.e. the user data can be any number of bits). For instance, for illustration purposes only and not by limitation, the user data can be 16 bit numbers or 32 bit numbers. In the example shown in the figure, the user data is the 4 bit number "0100."

At block 406, a pseudo random number is generated or retrieved. The pseudo random number illustratively has the same number of bits as the user data received at block 402. The pseudo random number optionally comes from within the flash memory device such as from its controller or buffer, or from an external source. In an embodiment, as indicated by block 404, the pseudo random number is generated by a linear feedback shift register (LFSR). The LFSR is optionally reset or seeded with a specific value at the beginning of a data set and is incremented with the passing of the data. Embodiments are not however limited to any particular method of generating pseudo random numbers. In the example shown in the figure, the pseudo random number is "0111."

At block 408, the transformed data that will be stored to flash memory is generated. The transformed data is illustratively generated by performing an "exclusive or" or "XOR" on the user data and the pseudo random number. In the example shown in FIG. 4, the user data "0100" is XOR'd with the pseudo random number "0111" to generate the transformed data "0011." At block 410, the transformed data (e.g. "0011") is stored to flash memory.

It is worth noting that in certain embodiments, the number of bits of the user data and the number of bits of the transformed data are the same. This may be advantageous in that there is no efficiency loss in the transformation process (i.e. it takes the same amount of memory to store the transformed data as it would take to store the original user data).

As can be seen in the simple example described above, the number of 0's stored to the memory is reduced using the method shown in FIG. 4 (i.e. the ratio of 1's to 0's in the transformed data is higher than the ratio of 1's to 0's in the user data). The user data (i.e. the "0100") that would normally be stored to the flash memory had three 0's. The transformed data (i.e. the "0011") that was stored only had two zeros. Accordingly, in a system that erases transistor values to 1 before writing, fewer transistors need to be switched to store the transformed data as compared to the untransformed user data.

Figure 5:
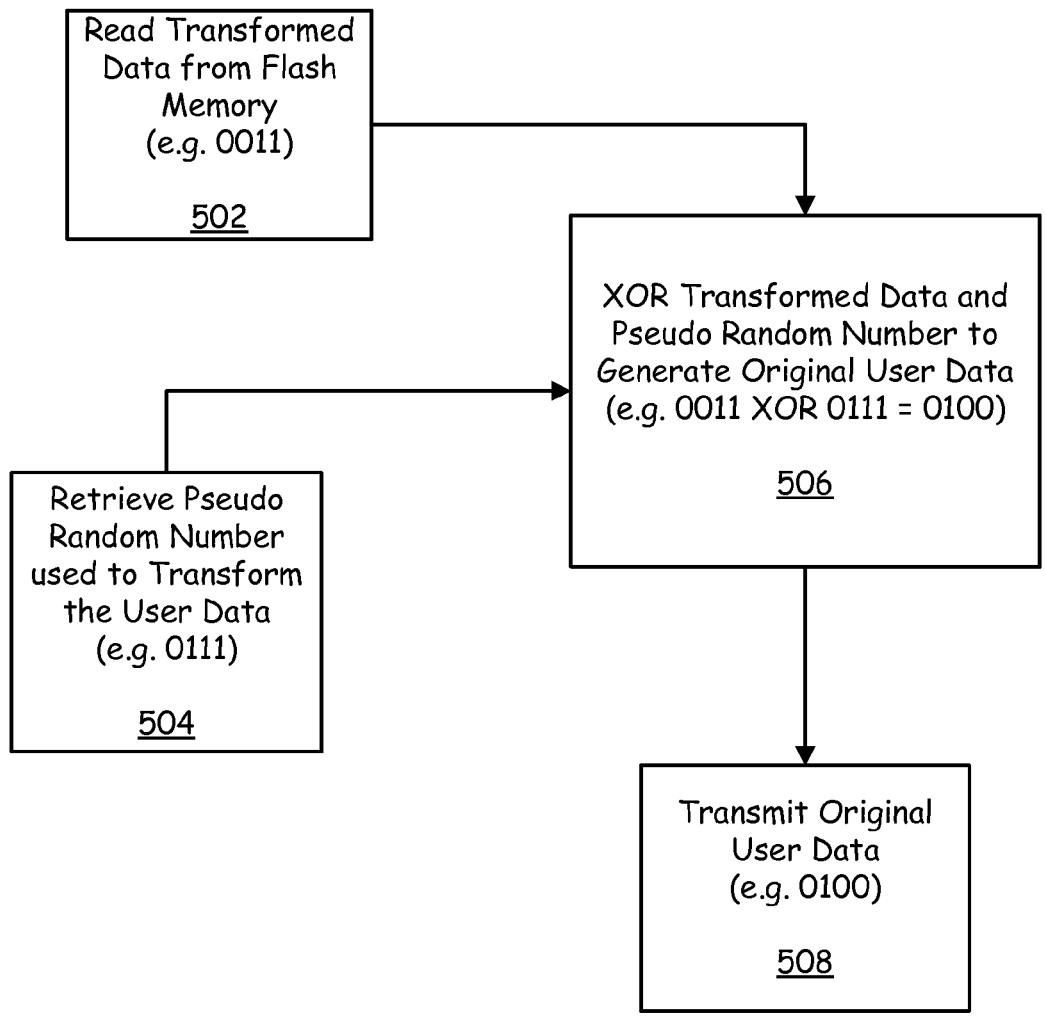
FIG. 5 is a block diagram of a method of decoding data that was encoded using the method of FIG. 4.

FIG. 5 is a block diagram of a method retrieving or decoding data in accordance with one embodiment of the present disclosure. The method of FIG. 5 is illustratively utilized to retrieve data that was stored according to the method of FIG. 4. At block 502, the values from the flash memory are read. The values illustratively correspond to the transformed data that was stored at block 410 in FIG. 4. In the example shown in FIG. 5, the values that are read are "0011."

At block 504, the pseudo random number that was used in transforming the data is retrieved or generated. For example, in an embodiment that utilizes a LFSR, the LFSR is reset or seeded with a value such that it generates the same number that was used in transforming the data. In the example shown in FIG. 5, the pseudo random number that is retrieved is "0111" which is the same as the pseudo random number at block 406 in FIG. 4.

At block 506, the inverse of the transform applied at block 408 in FIG. 4 is applied to the data read at block 502. In one embodiment, the inverse transform is the "exclusive or" function or "XOR." In the example shown in FIG. 5, the XOR value of the read data, "0011," and the pseudo random number, "0111" is computed as being "0100." As can be seen, the result of the inverse transformation process is the original user data from block 402 in FIG. 4. Accordingly, the methods shown in FIGS. 4 and 5 allow user data to be stored to and recovered from a memory device while still being able to transform the data to reduce the number of transistors that need to be switched.

At block 508, the user data is optionally transmitted. For example, for illustration purposes only and not by limitation, the user data is transmitted back to the device that originally sent the data at block 402 in FIG. 4.

Figure 6:
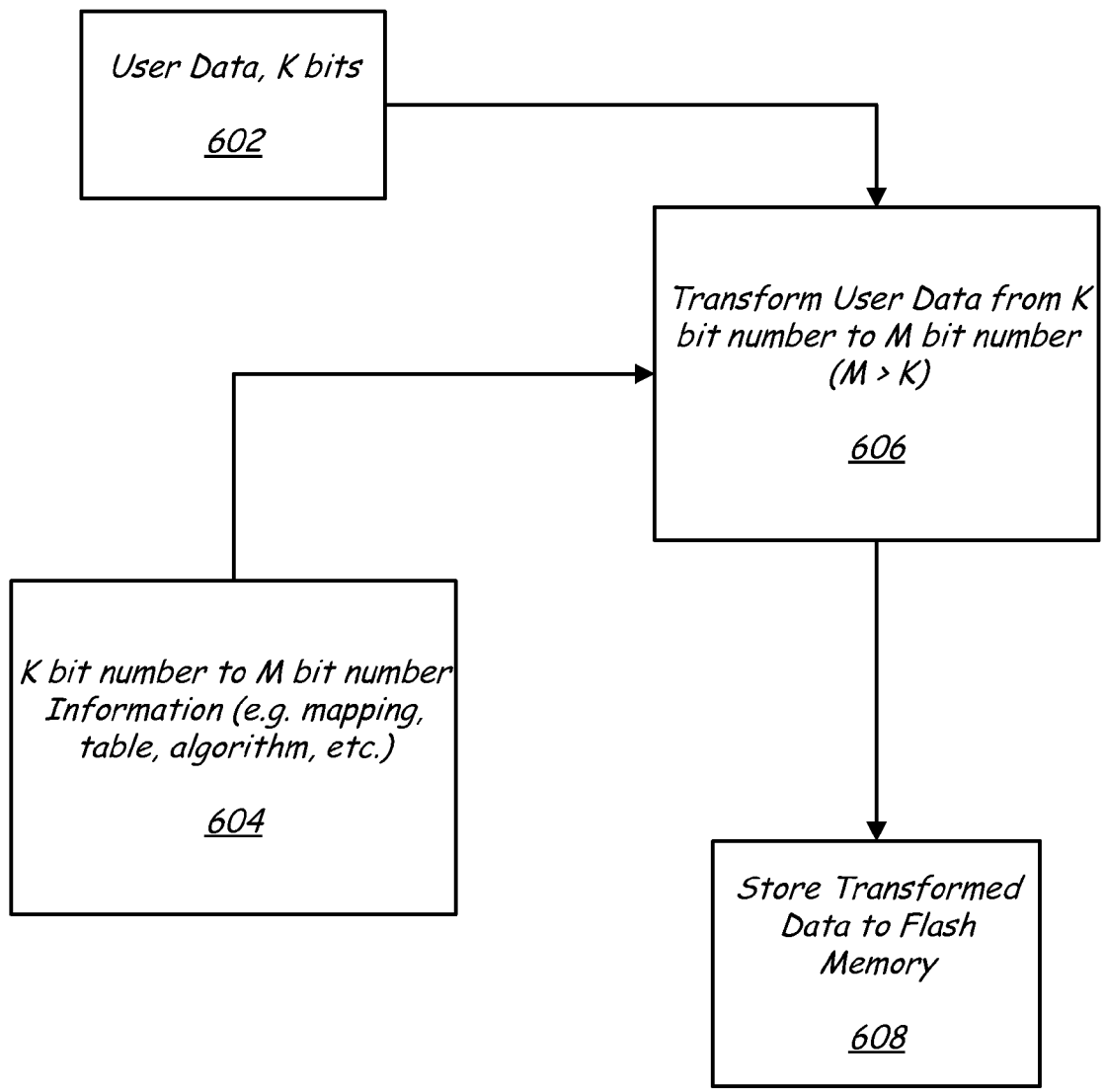
FIG. 6 is a block diagram of a method of encoding user data by converting the user data into a number having a greater number of bits.

FIG. 6 is a block diagram of another method of transforming user data. Similar to the method shown in FIG. 4, the method shown in FIG. 6 illustratively includes receiving user data at block 602, transforming the user data at block 606, and storing the transformed data at block 608. The method in FIG. 6 differs from that shown in FIG. 4 in the manner of transforming the user data. In FIG. 4, a pseudo random number is utilized in transforming user data. In FIG. 6, no pseudo random number is used. Instead, the user data is illustratively transformed into a number having a greater number of bits. FIG. 6 shows the user data being K bits and the transformed data being M bits. In an embodiment, M and K can both be any number provided that M is greater than K.

The transformed number illustratively has fewer 0's than the user data (i.e. the ratio of 1's to 0's is greater in the transformed data as compared to in the user data). For instance, in one embodiment, user data is segmented or received as 8 bit numbers. There are two hundred and fifty-six possible 8 bit numbers (i.e. 00000000 to 11111111). The 8 bit numbers are transformed into 10 bit numbers. There are one thousand and twenty-four possible 10 bit numbers (i.e. 0000000000 to 1111111111). Since there are more 10 bit numbers than there are 8 bit numbers, not all of the 10 bit numbers are needed to represent the 8 bit numbers. Accordingly, the 10 bit numbers that are used to represent the 8 bit numbers are selectively chosen to give a desired ratio of 1's to 0's. In one embodiment, a scheme is chosen such that transformed data has approximately an even number of 1's and 0's. In another embodiment, a scheme is chosen such that transformed data has more 1's or alternatively more 0's. Accordingly, user data is able to be transformed in such a way to control the data to be stored to flash memory (e.g. the ratio of 1's to 0's is controllable or predictable). This is illustratively used to reduce the amount of switching of values of transistors. In one embodiment, a DC balanced encoding/decoding scheme such as, but not limited to, 8b/10b or 69/70 rds coding, is utilized. Embodiments of the present disclosure are not however limited to any particular methods of transforming numbers.

As is indicated by block 604, transformation or conversion information is optionally generated or retrieved. For example, for illustration purposes only and not by limitation, if an 8b/10b scheme is utilized, a mapping of 8 bit numbers to 10 bit numbers is retrieved to determine what 10 bit number an 8 bit user data number corresponds to.

Figure 7:
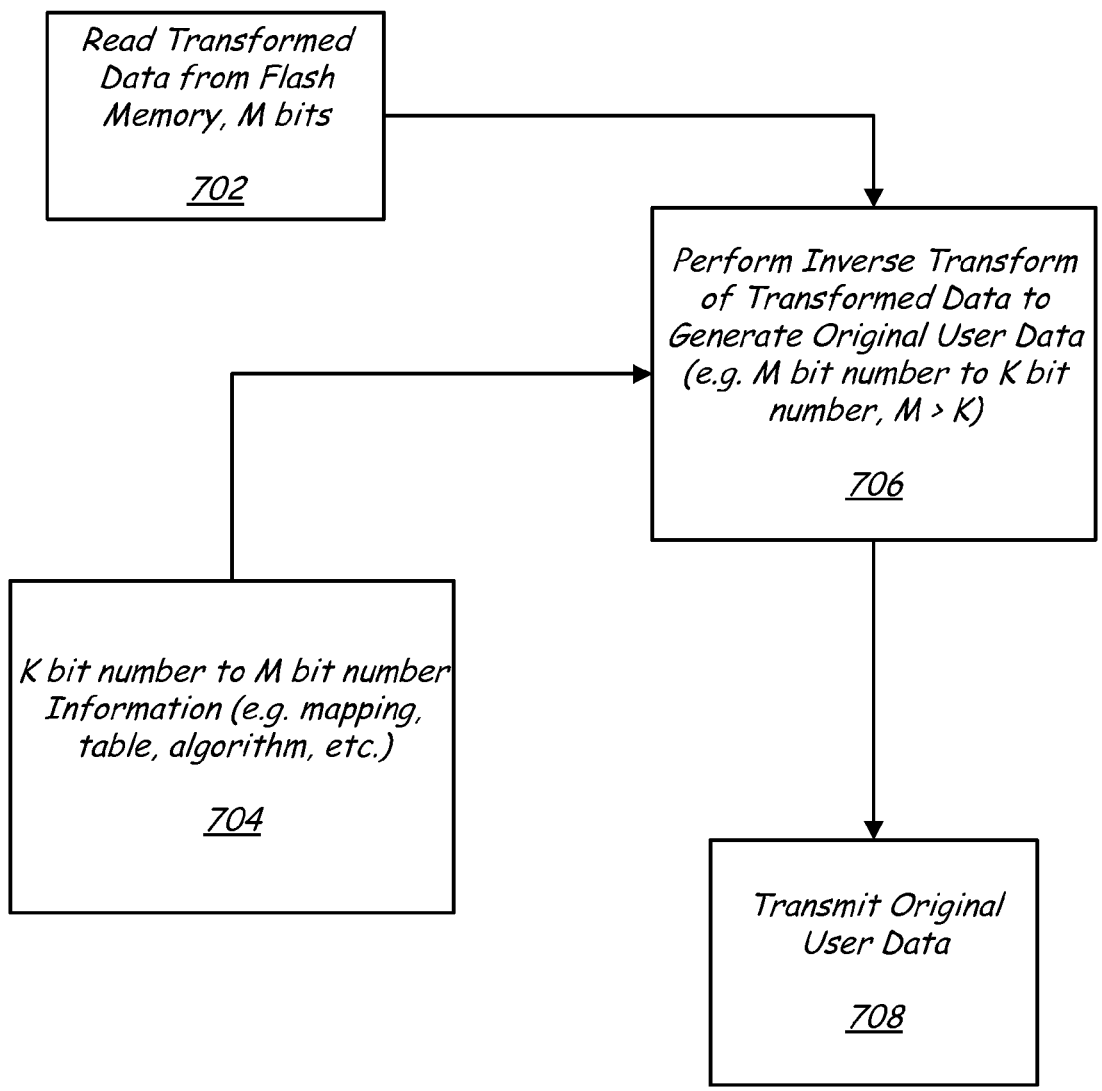
FIG. 7 is a block diagram of a method of decoding data that was encoded using the method of FIG. 6.

FIG. 7 is a block diagram of another method of retrieving or decoding data. The method of FIG. 7 is illustratively utilized to retrieve data that was stored according to the method of FIG. 6. At block 702, the values from the flash memory are read. The values illustratively correspond to the transformed data that was stored at block 608 in FIG. 6. At block 706, the inverse transform is applied to the data read from the flash memory. The process illustratively utilizes decoding information such as, but not limited to K bit number to M bit number conversion information at block 704. The inverse transformation illustratively generates the original user data that was received at block 602 in FIG. 6. For instance, in an embodiment that maps 8 bit numbers to 10 bit numbers at block 606 in FIG. 6, a 10 bit number is transformed back into the corresponding 8 bit number at block 706. At block 708, the original user data is optionally transmitted.

It is worth noting that in certain embodiments of methods described in FIGS. 6-7 that there is some efficiency loss. For example, it takes twenty-five percent more memory to store a 10 bit number as compared to an 8 bit number. The efficiency loss can be minimized by reducing the difference between M and K. For instance, in 69/70 encoding, 69 bit numbers are converted into 70 bit numbers. This results in an efficiency loss of only one and a half percent.

The methods shown in FIGS. 3-7 and described above transform incoming user data before storing the transformed data to flash memory. The incoming user data illustratively has an unknown or uncontrolled ratio of 1's to 0's. Storing this data directly may cause flash memory transistors to be switched more frequently which may result in shorter device lifetimes. In at least certain embodiments described above, the ratio of 1's to 0's is more controlled and is approximately known or is predictable. These methods may therefore help to extend the life of flash memory devices.

Finally, it is to be understood that even though numerous characteristics and advantages of various embodiments have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. In addition, although the embodiments described herein are directed to flash memory, it will be appreciated by those skilled in the art that the teachings of the disclosure can be applied to other types of data storage systems, without departing from the scope and spirit of the disclosure.

What is claimed is:

1. A method for use with a memory device in receipt of user data having an unknown ratio of 1's to 0's, the method comprising:
   utilizing a controller of the memory device to apply a transform to the user data to generate transformed data that has, a predictable ratio of 1's to 0's; and
   storing the transformed data to the memory device.

2. The method of claim 1, further comprising:
   retrieving the transformed data from the memory device; and
   generating the user data based at least in part by applying an inverse of the transform to the transformed data.

3. The method of claim 1, wherein the user data and the transformed data have the same number of bits.

4. The method of claim 1, wherein the transformed data has a greater number of bits than the user data.

5. The method of claim 1, wherein the transformed data has a higher ratio of 1's to 0's than the user data.

6. The method of claim 1, wherein the transformed data has an approximately equivalent number of 1's and 0's.

7. The method of claim 1, wherein applying the transform to the user data comprises applying an "exclusive or" function.

8. A method comprising:
receiving user data;
utilizing a controller of a memory device to transform the user data to reduce switching of flash memory transistors; and
storing the transformed data to the flash memory transistors.

9. The method of claim 8, further comprising:
generating a pseudo random number; and
utilizing the pseudo random number to transform the user data.

10. The method of claim 9, wherein an "exclusive or" function is applied to the user data and the pseudo random number to transform the user data.

11. The method of claim 9, wherein the pseudo random number is generated utilizing a linear feedback shift register.

12. The method of claim 8, further comprising:
retrieving the transformed data; and
applying an inverse transform to the transformed data to generate the user data.

13. The method of claim 12, wherein applying the inverse transform comprises applying an "exclusive or" function to the transformed data.

14. The method of claim 8, wherein the user data and the transformed data comprise the same number of bits.

15. The method of claim 8, wherein the user data comprises at least one 0 value and the at least one 0 value is represented with a 1 value in the transformed data.

16. The method of claim 8, wherein the transformed data has a greater number of bits than the user data.

17. The method of claim 8, wherein a DC balanced code is utilized to transform the user data.

18. The method of claim 17, wherein the DC balanced code comprises 8b/10b coding.

19. The method of claim 17, wherein the DC balanced code comprises 69/70 coding.

20. The method of claim 8, wherein each of the user data and the transformed data comprises a number of 0 values and wherein the number of 0 values in the transformed data is fewer than the number of 0 values in the user data.

21. A memory device comprising:
an interface that receives user data having an unknown ratio of 1's to 0's;
a controller that applies a transform to the user data to generate transformed data that has a predictable ratio of 1's to 0's; and
memory that stores the transformed data.

* * * * *